United States Patent
Darras (10) Patent No.: US 10,158,444 B1
(45) Date of Patent: Dec. 18, 2018

(54) EVENT-DRIVEN PRECISION TIME TRANSFER

(71) Applicant: MICROSEMI CORPORATION, Aliso Viejo, CA (US)

(72) Inventor: Samer Darras, Morgan Hill, CA (US)

(73) Assignee: Microsemi Corporation, Aliso Viejo, CA (US)

(*) Notice: Subject to any disclaimer, the term of this patent is extended or adjusted under 35 U.S.C. 154(b) by 0 days.

(21) Appl. No.: 15/815,335

(22) Filed: Nov. 16, 2017

(51) Int. Cl.
*H04J 3/06* (2006.01)
*H03K 3/01* (2006.01)

(52) U.S. Cl.
CPC ............ *H04J 3/0682* (2013.01); *H03K 3/01* (2013.01)

(58) Field of Classification Search
CPC ................................ H04J 3/0682; H03K 3/01
See application file for complete search history.

(56) References Cited

U.S. PATENT DOCUMENTS

| | | | | |
|---|---|---|---|---|
| 8,576,883 | B2* | 11/2013 | Lansdowne | H04J 3/0697 370/503 |
| 9,769,047 | B2* | 9/2017 | Tzeng | H04J 3/0661 |
| 9,912,693 | B1* | 3/2018 | Balmakhtar | H04L 63/1466 |
| 2010/0118895 | A1* | 5/2010 | Radulescu | G04G 7/00 370/503 |
| 2011/0150476 | A1* | 6/2011 | Zhao | H04J 3/0655 398/63 |
| 2012/0136956 | A1* | 5/2012 | Khoury | H04J 3/0667 709/208 |
| 2013/0170507 | A1* | 7/2013 | Hsueh | H04L 63/0428 370/503 |
| 2014/0177653 | A1* | 6/2014 | Tzeng | H04J 3/0635 370/503 |
| 2014/0269672 | A1* | 9/2014 | Zampetti | H04W 56/0015 370/350 |
| 2015/0063375 | A1* | 3/2015 | Tzeng | H04J 3/0673 370/512 |
| 2018/0152286 | A1* | 5/2018 | Kemparaj | H04L 7/0012 |

OTHER PUBLICATIONS

IEEE Std. 1588-2008, "IEEE Standard for a Precision Clock Synchronization Protocol for Networked Measurement and Control Systems," 2008.
"Network Time Protocol (Version 3)—Specification, Implementation and Analysis," RFC 1305, Internet Engineering Task Force (IETF), Mar. 1992.

* cited by examiner

*Primary Examiner* — Kenneth T Lam
(74) *Attorney, Agent, or Firm* — Glass & Assocates; Kenneth Glass (57) ABSTRACT

The present invention generally relates to methods and apparatuses for event-driven and stateless precision time transfer. In one embodiment, a master device creates and launches Precision Timing Protocol (PTP) Sync packets, as well as Follow-up packets in the case of two-step clock operation, on an event-driven basis in response to the receipt of a Delay Request message from a slave device, rather than based on scheduling performed by the master device. Doing so reduces the load on the master device and permits the master to serve a larger number of slave devices. In addition, PTP Announce messages, which are not used for calculating the time offset between master and slave devices, may be sent in response to some Delay Request messages using an adjustable sampling rate (e.g., 1 every x Delay Request messages).

16 Claims, 9 Drawing Sheets

| IPv4 Delay Request Message Frame | | |
|---|---|---|
| Byte Offset | Field Information | Region |
| 0 | Destination MAC Address | Ethernet Header |
| 6 | Source MAC Address | |
| 12 | Ether Type | |
| 14 | IP Version, Header length, and Type of Service | Ethernet Header |
| 16 | Total Length | |
| 18 | Identification | |
| 20 | Flags and Fragment offset | |
| 22 | TTL and Protocol Type | |
| 24 | IP Checksum | |
| 26 | Source IP Address | |
| 30 | Destination IP Address | |
| 34 | UDP Source Port number | UDP Header |
| 36 | UDP Destination Port number | |
| 38 | UDP data length | |
| 40 | UDP checksum | UDP Header |
| 42 | PTP Transport specific and message type | |
| 44 | PT message length | |
| 46 | Domain Number | |
| 48 | Flags | |
| 50 | Correction Field | |
| 62 | Clock Identity | |
| 70 | Port Identity | |
| 72 | PTP Sequence ID | |
| 74 | Control and messaging interval | |
| 76 | PTP seconds timestamp | PTP Body |
| 82 | PTP nanoseconds timestamp | |

EVENT-DRIVEN PRECISION TIME TRANSFER

BACKGROUND OF THE INVENTION

Field of the Invention

Embodiments of the present invention relate generally to time and frequency alignment systems operating over packet-switched communications networks and, more specifically, to methods and apparatuses for event-driven precision time transfer.

Description of the Related Art

It has been recognized that synchronizing network elements in communications networks to a high level of precision enables the provisioning of advanced services. In fact, time and frequency alignment is essential to certain types of systems. For example, accurate time alignment is required by cellular networks, services carried out in real time over a network, and network elements that use packet-based signal formats for multiplexing, transmission, and switching. Similarly, frequency alignment is required in time-division multiplexing (TDM) and media streaming systems that require fixed video or audio sample rates across multiple clients. Modern mobility services are demanding more and more bandwidth and lower and lower latency, placing increasing demands for tight time coordination in the wireless transport (radio access networks). Another example is the demand for much higher time coordination of transactions in high speed financial trading. To gain some perspective into the increasing demand on precision, whereas legacy time distribution targets at the more stringent end were on the order of sub-milliseconds, emerging application and services targets are now on the order of sub-microseconds.

The distribution of time over packet networks is now common in the industry. The dominant method is the use of the Network Timing Protocol (NTP) for support of general timing applications in general computing applications. However, these implementations, based on existing standards and conventions are only suitable for time alignments on the order of (several) milliseconds. Precision Timing Protocol (PTP) is a relatively newer protocol supported by industry standards (IEEE 1588-2008, ITU-T Recommendations in the G.827x series) and provides higher levels of precision that can support the needs of a variety of new applications and services.

Packet-based network synchronization methods such as PTP transfer time and frequency references using packets containing time stamps that identify the times of departure/arrival of packets. These protocols can be used to distribute timing and frequency alignment throughout a network in a point-to-point fashion similar to the way that TDM networks distribute frequency alignment.

A PTP "grandmaster", which is the root timing reference, can transfer time to a network element coupled to it, a "slave" instantiated on that network element can reconstitute the time, and then a "master" connected to the slave in the same network element can transfer time to a subsequent network element in this point-by-point fashion. A device that has both slave and master functions and which can be used to transfer time in a relay fashion is referred to as a "boundary clock."

In Unicast profiles, PTP is a stateful protocol in that certain messages (specifically PTP Announce and Sync messages) are transmitted from master to slave at rates request by the slave. The scheduling of such messages for transmission is a stateful process that requires timers in hardware and/or software in order for the master to send the messages at appropriate intervals. This results in a scaling problem, as the master may be unable to handle the load of scheduling such messages for a large number (e.g., thousands) of slave devices.

SUMMARY OF INVENTION

Embodiments disclosed herein generally relate to methods and apparatuses for event-driven and stateless precision time transfer.

In one aspect, a method is provided for synchronizing a clock in a slave device (slave) with a clock in a master device (master). The method generally includes transmitting a first packet from the slave to the master and, responsive to receiving the first packet at the master: determining, by the master, a time of arrival of the first packet at the master and an identifier (ID) value associated with the first packet; transmitting, from the master to the slave, a second packet which includes the time of arrival of the first packet at the master and the ID value associated with the first packet; and transmitting, from the master to the slave, a third packet which includes the ID value associated with the first packet. The method further includes synchronizing the clock in the slave device with the clock in the master device based, at least in part, on a time of departure of the first packet from the slave, the time of arrival of the first packet at the master, a time of departure of the third packet from the master, and a time of arrival of the third packet at the slave.

In another aspect, a system including a master device (master) and a slave device (slave) is provided. The master is configured to perform operations including, responsive to receiving a first packet transmitted from the slave: determine a time of arrival of the first packet at the master and an identifier (ID) value associated with the first packet; transmit to the slave a second packet which includes the time of arrival of the first packet at the master and the ID value associated with the first packet; and transmit to the slave a third packet which includes the ID value associated with the first packet. The slave is configured to perform operations including: transmit the first packet to the master; determine a time of departure of the first packet from the slave; determine a time of arrival of the third packet at the slave; and synchronize a clock in the slave with a clock in the master based, at least in part, on the time of departure of the first packet from the slave, the time of arrival of the first packet at the master, a time of departure of the third packet from the master, and the time of arrival of the third packet at the slave.

In yet another aspect, a clock device is provided that includes one or more circuits. The one or more circuits are configured to perform operations including, responsive to receiving a first packet from a slave device (slave): determine a time of arrival of the first packet and an identifier (ID) value associated with the first packet, transmit to the slave a second packet which includes the determined time of arrival of the first packet and the ID value associated with the first packet, transmit to the slave a third packet which includes the ID value associated with the first packet, and transmit to the slave a fourth packet which includes a time of departure of the third packet from the clock device and the ID value associated with the first packet.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Figure 1:
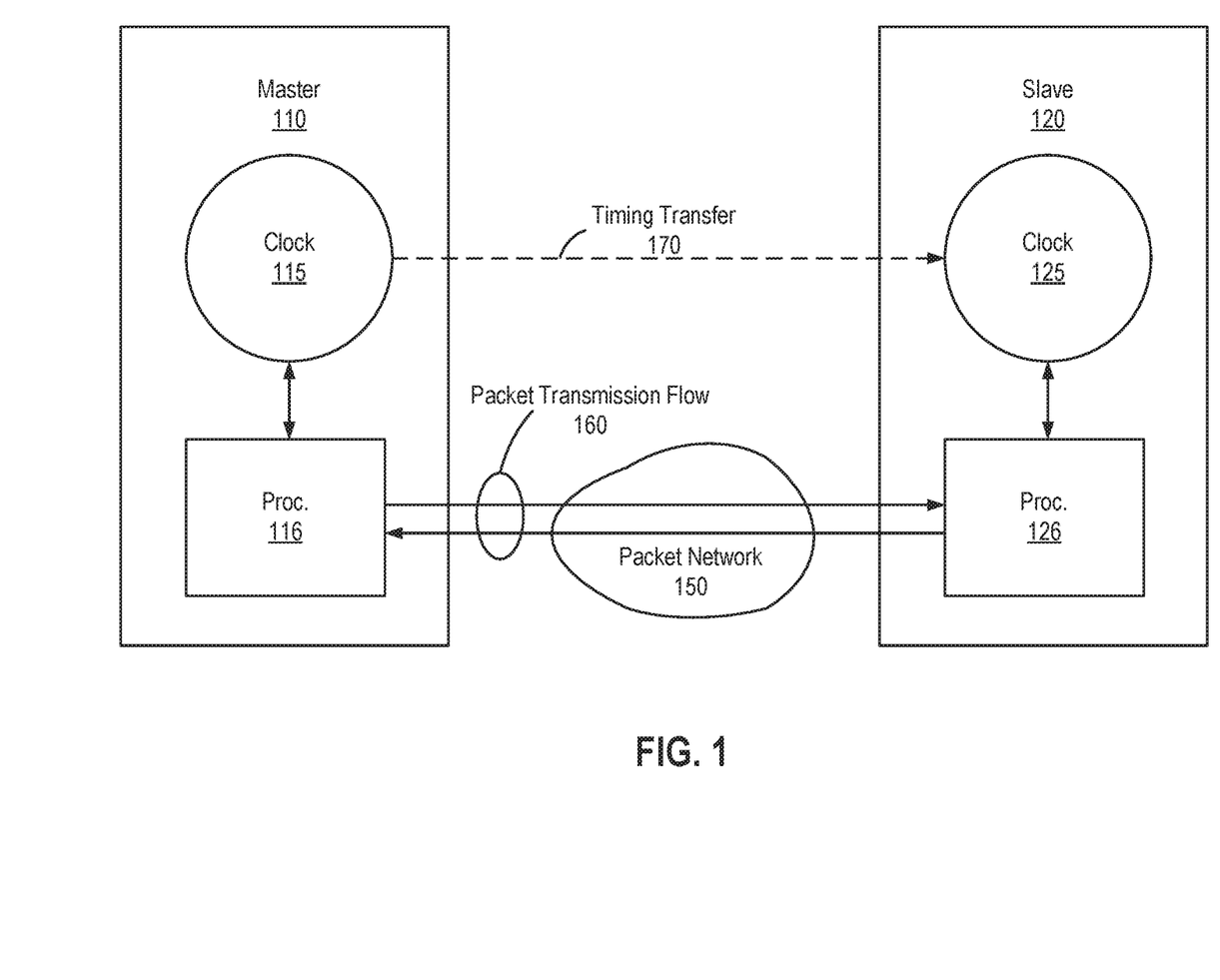
FIG. 1 depicts an arrangement for aligning a slave clock to a master clock using packet-based methods.

FIG. 1 depicts a connection between a master device 110 ("server") and a slave device 120 ("client") communicating over network 150. As shown, the master device 110 can achieve timing transfer 170 from its own master clock 115 to a slave clock 125 inside the slave device 120 by exchanging packets with time-stamps contained in a packet transmission flow 160 between processing elements 116 (master) and 126 (slave) over a packet network 150.

The processing elements 116 and 126, which may include one or more field-programmable gate arrays (FPGAs) and/or one or more central processing units (CPUs) running software, are responsible for creating packets that are transmitted in the packet transmission flow 160 and processing packets received via the packet transmission flow 160. Packet-based methods may be employed to establish the "offset from master" (OFM) of the slave device 120. That is, if the master time is denoted by $T_M$ and the slave time by $T_S$, then the goal is to establish $\varepsilon$ where $T_S=T_M+\varepsilon$, which can in turn be used to correct the slave clock 125. For example, the slave device 120 may be one of a number (e.g., thousands) of servers in a datacenter that need to be synchronized within some accuracy. As another example, the slave device 120 may be one of a number of receivers connected to a cable backhaul that needs to be synchronized to a source in order to buffer received video frames in a correct order.

Figure 2:
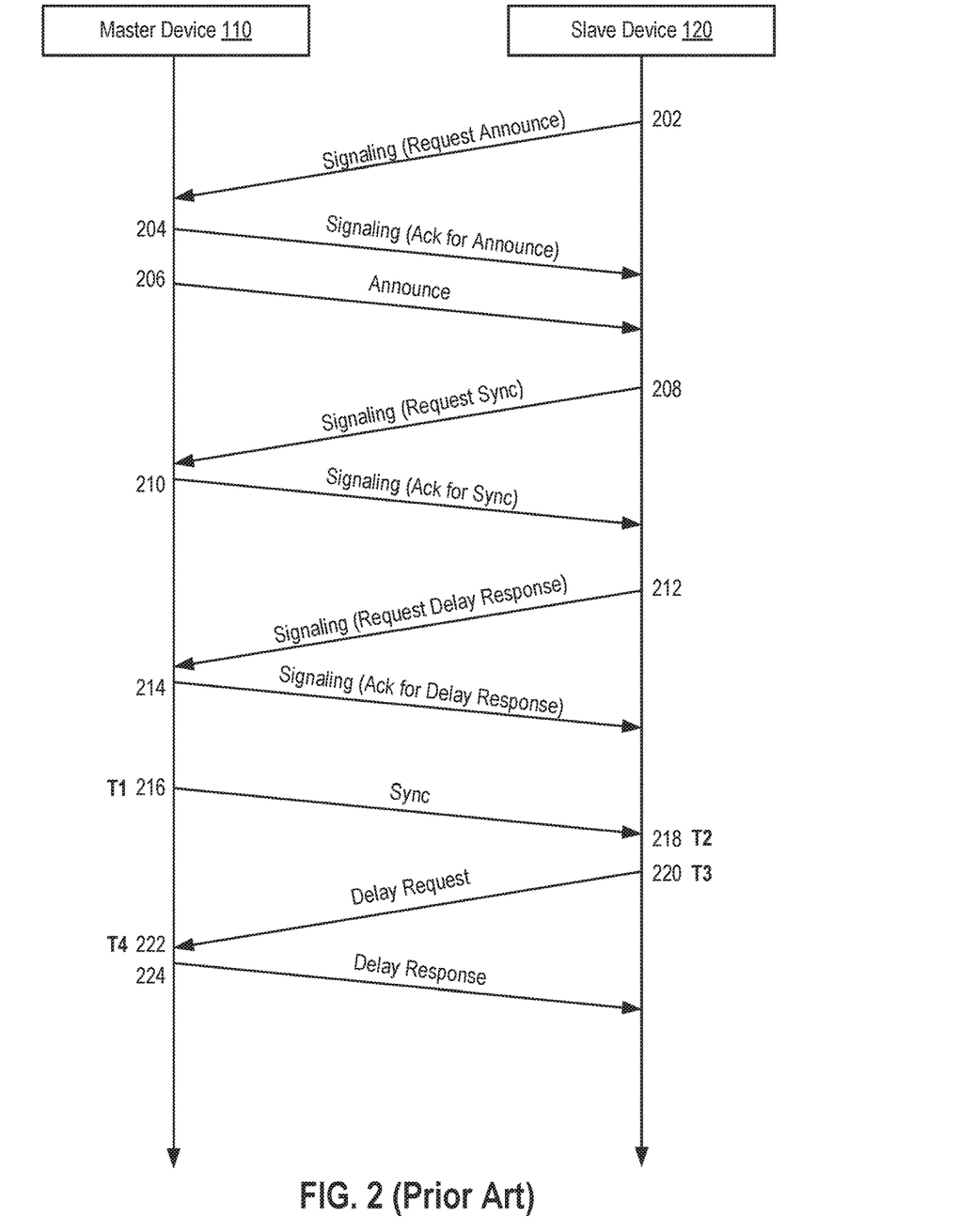
FIG. 2 provides an event diagram illustrating unicast communication between master and slave clocks in the conventional Precision Timing Protocol (PTP).

As described, Precision Timing Protocol (PTP) is a protocol that provides relatively high levels of precision and can support the needs of a variety of applications and services. FIG. 2 illustrates an example of the master device 110 and the slave device 120 using conventional PTP unicast communication to exchange PTP packets. Unicast mode is preferred over multicast communication in some environments, such as data centers. As shown in FIG. 2, the slave device 120 initiates negotiation with the master device 110 to request services including an Announce message service and service for Sync and Delay Response messages at events 202, 208, and 212, respectively. "Messages" is used interchangeably with "packets" herein. In unicast negotiation, network (IP) address(es) of master clock source(s), such as the master device 110, are preconfigured on the slave device 120. The slave device 120 transmits to the master device 110's network address requests for each of type of message that the slave device 120 wants from the master device 110. Negotiation messages from slave devices are also referred to as "Signaling Requests," and replies from a master are also referred to as "Signaling Acknowledgements." Although three Signaling Request messages from the slave device 120 are shown for illustrative purposes, it should be understood that multiple requests may also be made with a single Signaling message by using the multiple Type Length Value (TLVs) datagram in the message.

Assuming the master device 110 has sufficient capacity to handle the slave's 120 request for the Announce message service, the master device 110 replies at event 204 with a Signaling Acknowledgement message indicating that the Announce service is granted. Then, at event 206, the master device 110 transmits Announce messages per the request by the slave device 120, including at the rate requested by the slave device 120 in the Signaling message requesting the Announce message service. Announce messages indicate characteristics of the master device 110, which can be used by the slave device 120 in determining whether to request service for Sync and Delay Response messages from the master device 110. For example, the slave device 120 may determine that the Quality Level (QL) value specified in the Announce message transmitted at event 206 is acceptable and then request Sync and Delay Response message services from the master device 110 at events 208 and 212, respectively. In turn, the master device 110 replies with Signaling Acknowledgement messages indicating that the Sync and Delay Response message services are granted at events 210 and 214, respectively.

Similar to the Announce messages described above, the master device 110 transmits Sync messages per the request made by the slave device 120, including at the rate requested by the slave device 120 in the Signaling message requesting the Sync message service. As described, the process of transmitting Announce and Sync messages at requested rates is stateful and requires timers in hardware and/or software in order for the master device 110 to send Announce and Sync messages at the appropriate intervals. However, the master device 110 may be unable to handle the load of scheduling Announce and Sync messages for a large number (e.g., thousands) of slave devices, creating a scaling problem.

After a lease has been established between the slave device 120 and the master device 110 through the negotiation process above, the offset from master of the slave device 120 may be determined by exchanging PTP Snyc, Follow-up, Delay Request, and Delay Response messages as follows. At event 216, a Sync packet is transmitted by the master device 110 and the time-of-departure of the Sync packet is $t_1$. This time-of-departure from the master device 110 of the Sync packet will be referred to as T1. Here, "referred to" means the time-of-departure time-stamp is being given the name T1, while the value of the time-of-departure time-stamp is $t_1$. Although the transmission of one Sync packet is shown for illustrative purposes, it should be understood that, as described, the master device 110 may generally schedule the periodic transmission of Sync messages, based on the rate requested by the slave device 120, for a certain duration of time that may also be requested by the slave device 120. In addition, the time-of-departure $t_1$ may either be transported in the Sync message itself as T1, if the master device 110 is behaving as a one-step clock or, alternatively, in a separate Follow-up message corresponding to the Sync message if the master device 110 is behaving as a two-step clock (not shown), as described in greater detail below.

At event 218, the Sync packet arrives at the slave device 120, which measures the time-of-arrival as $\tau_2$; assuming that the slave time offset from master is $\varepsilon$, the actual time-of-arrival with respect to the master timescale is $t_2=\tau_2-\varepsilon$. The time-of-arrival time-stamp of the Sync message at the slave device 120 is referred to as T2.

At event 220, a Delay Request packet is transmitted by the slave device 120 that notes the time-of-departure as $\tau_3$. Assuming that the slave time offset from master is $\varepsilon$, the actual time-of-departure with respect to the master timescale is $t_3=\tau_3-\varepsilon$. This time-of-departure time-stamp from the slave device 120 of the Delay Request packet is referred to as T3.

At event 222, the Delay Request packet arrives at the master device 110, which measures time-of-arrival as $t_4$. The time-of-arrival time-stamp of the Delay Request message at the master device 110 is referred to as T4.

In response to receiving the Delay Request message, the master device 110 transmits to the slave device 120 a Delay Response message that includes the measured time-stamp T4 at event 224. The two-way exchange of packets in PTP can provide four time-stamps related to time-of-arrival and time-of-departure, namely the quartet (T1, T2, T3, T4). This information is suitable for allowing the slave device 120 to align in time with the master device 110 (assuming that the slave has knowledge of all the time-stamps). For simplicity of explanation, it is assumed herein that the message rates for Sync and Delay Request packets are equal (some digital signal processing may be employed to construct time-stamp sequences that are aligned in rate and sampling grid), and the packet exchanges may be organized appropriately in individual two-way exchanges. Denoting by $\Delta_{MS}$ and $\Delta_{SM}$ the respective transit delays between the Master and Slave and vice versa, the following equations can be established:

$$t_4=\tau_3-\varepsilon+\Delta_{SM}(\text{from an } S\text{-to-}M \text{ packet})$$

$$t_1=\tau_2-\varepsilon-\Delta_{MS}(\text{from a } M\text{-to-}S \text{ packet}) \quad \text{(Eq. 1)}$$

The estimate of forward (master-to-slave) transit delay, $\Delta_F$, is given by:

$$\Delta_F=\tau_2-t_1 \quad \text{(Eq.2)}$$

And the estimate of reverse (slave-to-master) transit delay, $\Delta_R$, is given by:

$$\Delta_R=t_4-\tau_3 \quad \text{(Eq.3)}$$

The round-trip delay, RTD, is then estimated as:

$$\text{RTD}=(t_4-\tau_3)+(\tau_2-t_1) \quad \text{(Eq. 4)}$$

The two quantities in parentheses on the right-hand side of (Eq. 4) comprise the reverse and forward offset measurements, respectively.

As there are two equations with three unknowns ($\varepsilon$, $\Delta_{MS}$, $\Delta_{SM}$), it is common in PTP to assume reciprocity of transit delay between the two devices, i.e. $\Delta_{MS}=\Delta_{SM}$, thereby reducing the number of unknowns to 2 and permitting $\varepsilon$, the slave time offset from master, to be solved for. Techniques for correcting asymmetry of transit delay in the forward (master-to-slave) and reverse (slave-to-master) directions, i.e., when $\Delta_{MS}=\Delta_{SM}$ does not hold true, are disclosed in, for example, U.S. Pat. No. 8,594,134, entitled "Precision Time Transfer over Optical Fiber," U.S. Pat. No. 9,264,132, entitled "Universal Asymmetry Correction for Packet Timing Protocols," U.S. Pat. No. 8,600,239, entitled "Precise Clock Synchronization Over Optical Fiber," and U.S. Pat. No. 9,698,926, entitled "Distributed Two-Step Clock," which are each incorporated by reference in their entireties herein.

Figure 3:
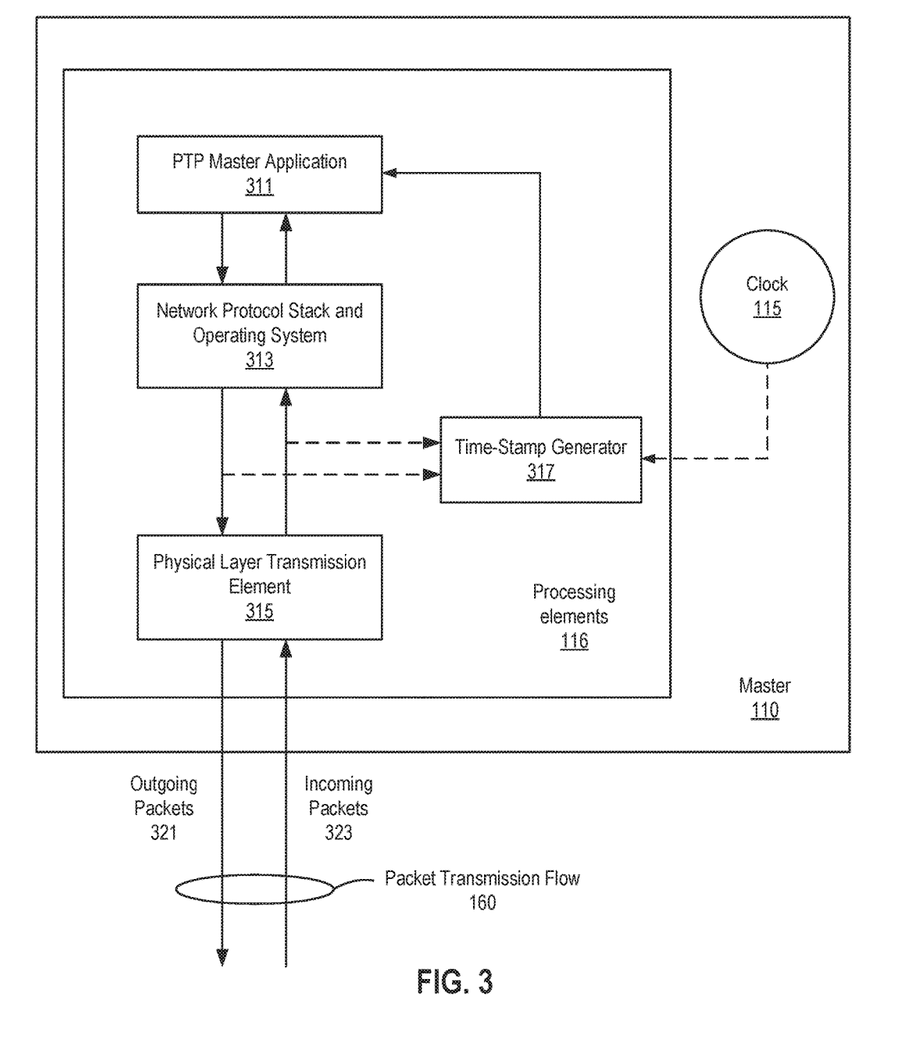
FIG. 3 depicts functional components of a master clock device, according to an embodiment.
Figure 4:
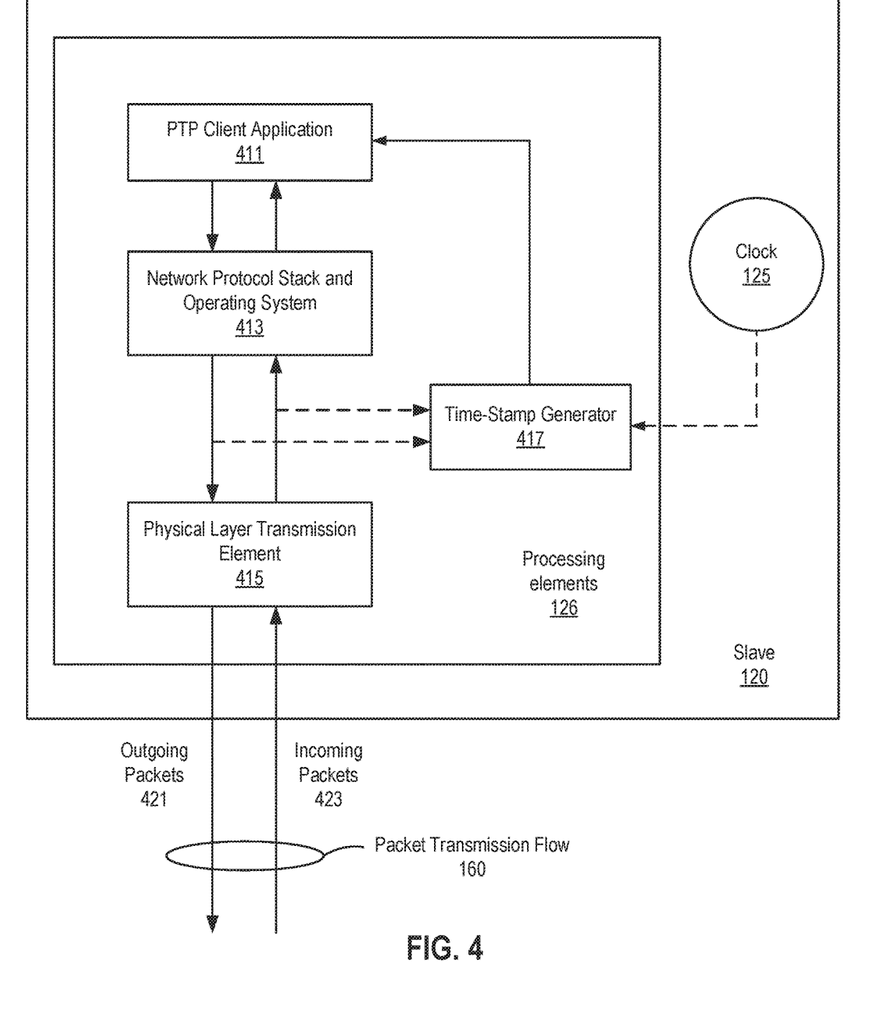
FIG. 4 depicts functional components of a slave clock device, according to an embodiment.

In contrast to the stateful implementation of conventional PTP, embodiments disclosed herein provide an event-driven, stateless approach for precision time transfer. The functional components of the master clock device 110 according to an embodiment are depicted in FIG. 3 and the components of the slave device 120 according to an embodiment are depicted in FIG. 4. As shown in FIG. 3, PTP master application 311 in the master device 110 creates and launches Delay Response and Sync messages on an event-driven basis in response to receipt of Delay Request messages from a slave device (e.g., the slave device 120) as incoming packets 323, rather than based on scheduling performed by the master device 110 itself. The Delay Response and Sync packets are processed through a network protocol stack and operating system 313 and eventually delivered to the physical layer transmission element 315 and then launched into the network as outgoing packets 321 within the packet timing flow 160. In one embodiment (one-step clock operation), the Sync packet may include a field for the time-of-departure time-stamp T1, and the Delay Response packet may include a field for the time-of-arrival time-stamp of the Delay Request packet T4. On the other hand, in two-step clock operation, passage of the first bit of the Sync packet may trigger master clock 115 to establish the true value of the time-of-departure $t_1$. Such a case is shown, in which the time-stamp for the true time-of-departure T1 is struck when the designated event (e.g., the first bit of the SYNC packet) traverses the connection between the MAC (bottom of protocol stack) and the PHY, the time-stamp generator 317 informs the PTP master application 311 of the true value of $t_1$ by providing it with the true value time-stamp T1, and the PTP master application 311 then launches a Follow-up packet that provides the true value T1 that can be used to determine the slave time offset from master. In addition to Delay Response and Sync messages, Announce messages, which are not used for calculating the time offset between the master device 110 and the slave device 120, may be sent in response to some Delay Request messages using an adjustable sampling rate (e.g., 1 every x Delay Request messages), as described in greater detail below.

As shown in FIG. 4, PTP client (slave) application 411 in the slave device 120 understands the PTP protocol and schedules transmission of Delay Request messages at a particular rate (e.g., 32 packets per second) to preconfigured network (IP) address(es) of master clock source(s), such as the master device 110. In contrast to conventional PTP, the transmission of Delay Request messages in embodiments disclosed herein is not in response to the slave device 120 receiving Sync messages from the master device 110. That is, the slave device 120 is configured to send scheduled Delay Request messages as outgoing packets 421 without waiting for Announce or Sync messages from the master device 110. Similar to the processing of Delay Response and Sync packets described above, Delay Request Messages may be processed through a network protocol stack and operating system 413 of the slave device 120, delivered to a physical layer transmission element 415, and then launched into the network as outgoing packets 421 within the packet timing flow 160. The slave device 120 then receives, from the master device 110, the Sync and Delay Response messages (and Follow-up messages in the case of two-step clock operation) described above as incoming packets 423. In turn, PTP client application 411 uses the T1 and T4 time-stamps in the Sync (or Follow-up) and Delay Response messages, respectively, as well as the time-of-departure time-stamp T3 of the original Delay Request packet and the time-of-arrival time-stamp T2 of the Sync packet that the slave device 120 itself measures, with time stamping being carried out by time stamp generator 417 based on local time supplied by the slave clock 125, to compute the slave time offset from master and correct the slave clock 125.

Although discussed herein primarily with respect to conventional PTP and event-driven PTP according to certain embodiments, it should be understood that a master device such as the master device 110 may be configured to support both modes of operation. For example, user-configurable parameters may be provided in the master and slave devices that permit a user (e.g., a network administrator) to switch between the two modes of operation, i.e., the user may turn the event-driven PTP disclosed herein on or off by programming the master and slave devices to be in one mode or the other. As another example, a master device may include multiple ports that have different network (IP) addresses and run in different modes. In such a case, slave devices that do not support event-driven PTP may be configured to communicate (via the appropriate network address(es)) with port(s) that run conventional PTP, while slave devices that do support event-driven PTP may be configured to communicate with port(s) that run event-driven PTP.

Figure 5:
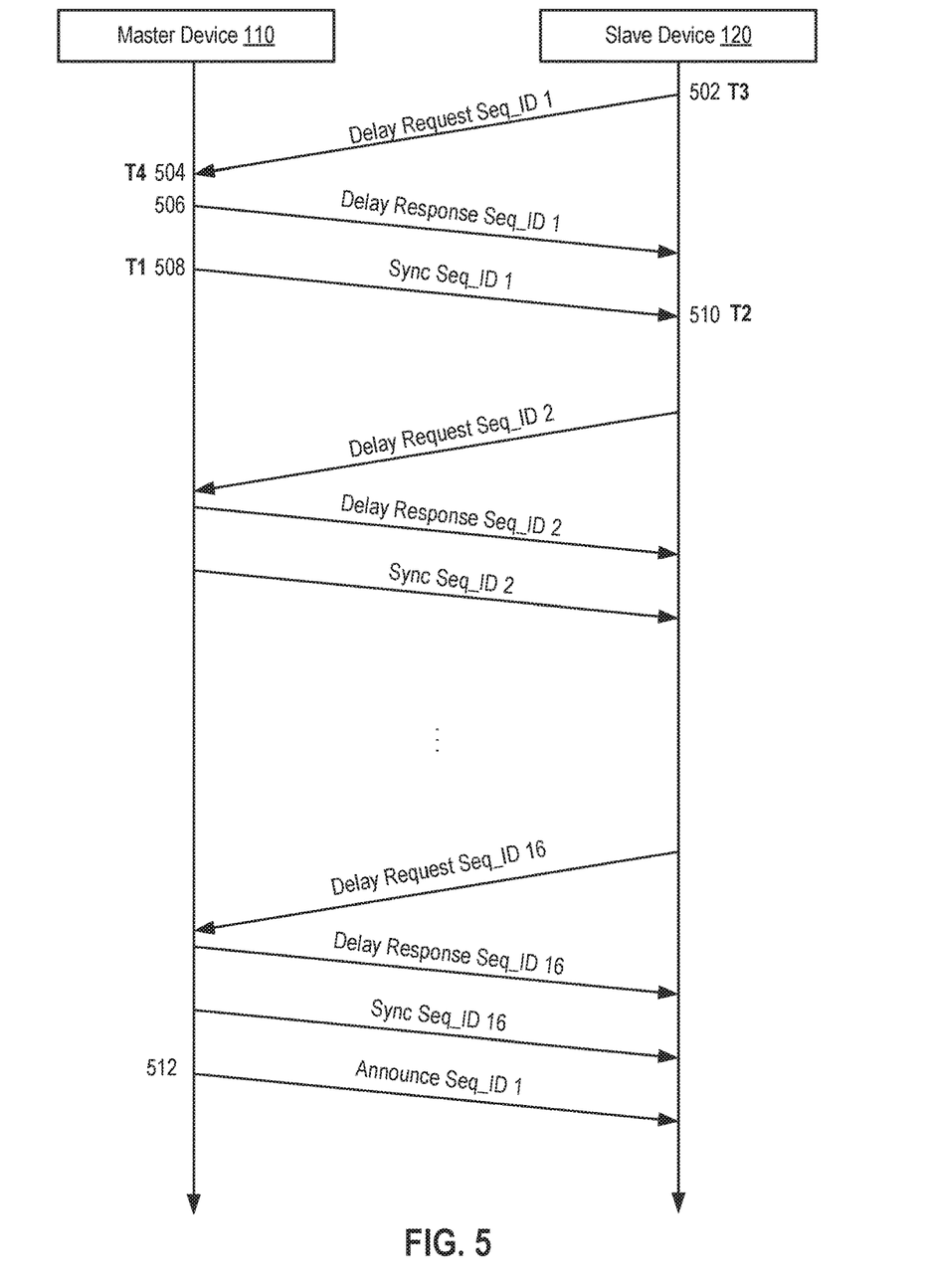
FIG. 5 provides an event diagram illustrating communications between master and slave in an event-driven one-step clock operation, according to an embodiment.

FIG. 5 provides an event diagram illustrating communications between master and slave in an event-driven one-step clock operation, according to an embodiment. As shown, at event 502, slave device 120 transmits a Delay Request message and records a time-of-departure $\tau_3$ of the Delay Request message in the time-stamp T3. Assuming that the slave time offset from master is $\varepsilon$, the actual time-of-departure with respect to the master timescale is $t_3 = \tau_3 - \varepsilon$, where $\varepsilon$ is the slave time offset from master.

Figure 6:
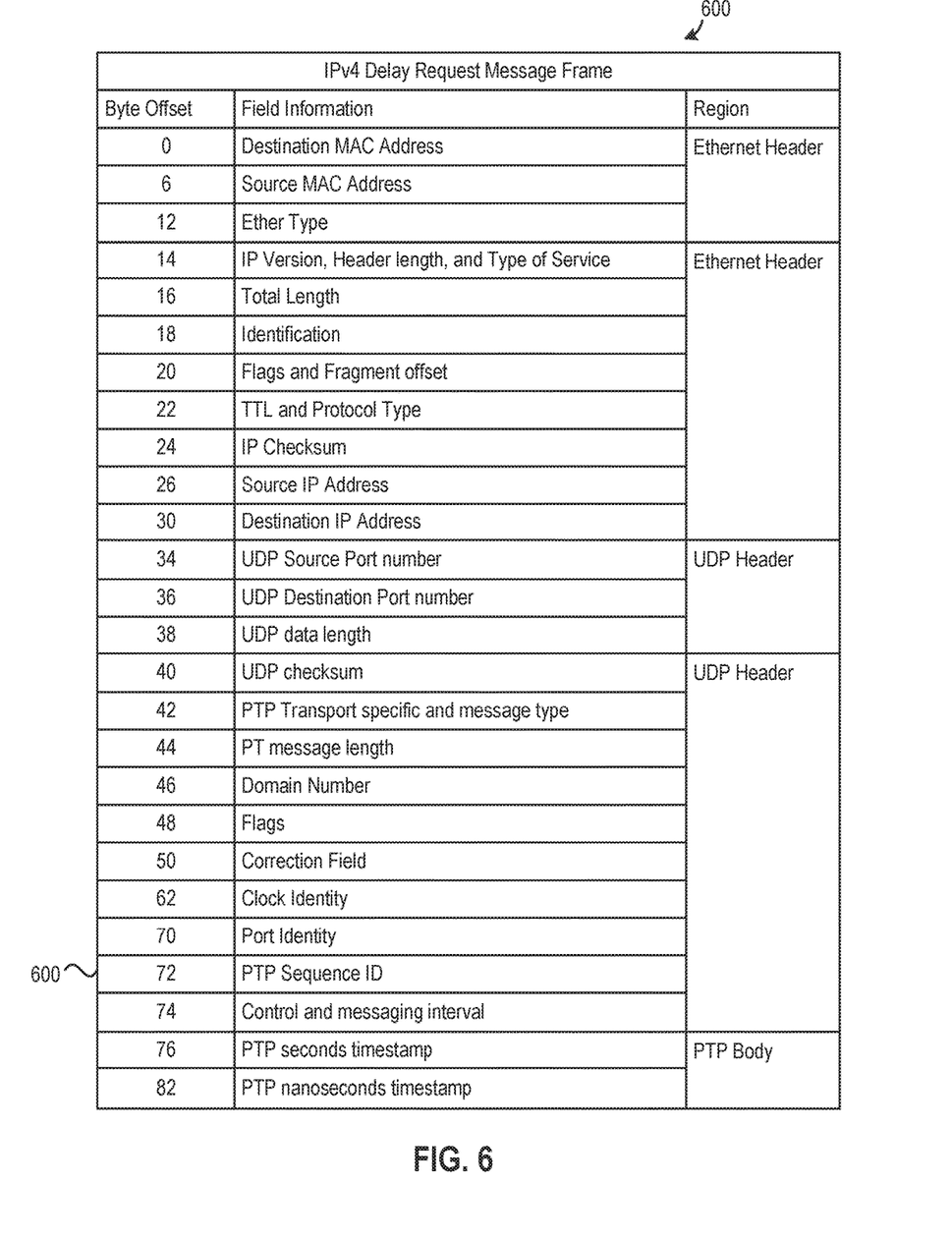
FIG. 6 illustrates contents of an example Internet Protocol version 4 (IPv4) PTP Delay Request message.

At event 504, the Delay Request message arrives at the master device 110, which measures time-of-arrival $t_4$ in the time-stamp T4. At event 506, the master device 110 transmits to the slave device 120 a Delay Response message that includes the measured time-stamp T4. This Delay Response reply to the Delay Request message is similar to the Delay Response message transmitted at event 224, described above. As shown, the master device 110 generates the Delay Response message with a sequence identifier (ID) Seq_ID 1 captured from the Delay Request message. Sequence ID may be among certain fields in the Delay Request message that the master device 110 captures and saves, and then includes in the Delay Response reply to the slave device 120. Sequence ID in particular is used by PTP to track packets so that missing and duplicated packet can be detected, and the sequence ID in the Delay Response may be used to identify the pair of Delay Request/Response messages. In one embodiment, sequence ID may be incremented by 1 in every Delay Request message, as shown in FIG. 5. FIG. 6 illustrates contents of an example Internet Protocol version 4 (IPv4) PTP Delay Request message 600, including a PTP sequence ID 610 field at byte offset 72. It should be understood that techniques disclosed herein are also applicable to other packet formats that include sequence identifiers, such as IPv6 Delay Request messages.

In addition to responding to the Delay Request message with a Delay Response message, the master device 110 uses the same event-driven approach to generate and transmit a Sync message, at event 508. The time-of-departure of the Sync packet is measured as $t_1$ for a time-stamp T1 and added to the Sync message. That is, the master device 110 replies to the Delay Request message with the typical Delay Response message as well as a Sync message. As shown, the Sync message is generated to include the sequence ID Seq_ID 1 captured from the Delay Request message, identifying a correspondence between this Sync message and the Delay Request and Delay Response messages with the same sequence ID. When the Sync message arrives at the slave device 120 at event 510, the slave device 120 measures the time-of-arrival as $\tau_2$ for a time-stamp T2. The time of arrival $\tau_2$ is, with respect to the master timescale, an actual time-of-arrival of $t_2 = \tau_2 - \varepsilon$.

Subsequent to receiving the Sync message and measuring its time-of-arrival, the slave device 120 uses the quartet of time-stamps (T1, T2, T3, T4) to align to the master device 110 by solving for the slave time offset s in the same manner described above, and adjusting the slave clock 125 based on the slave time offset. That is, although the time-stamps T1, T2, T3, and T4 are measured and/or sent in a different order than in conventional PTP, the four time-stamps needed to compute the slave time offset $\varepsilon$ are still obtained by the slave device 120 and used to align the slave clock 125.

In one embodiment, in addition to responding to Delay Request messages with Delay Response and Sync messages, the master device 110 may also use the same event-driven approach to generate and transmit Announce messages in response to certain Delay Request messages. It should be understood that Announce messages may be required for, e.g., UTC conversion or time-scale conversion, among other things. In contrast to conventional PTP, lease negotiation is optional, and the slave device 110 may run the full protocol, i.e. Announce, Sync, and Delay, in order to select a best master clock (BMC) if multiple master clocks are available, which is unlike the conventional PTP negotiation described above in which the slave device 110 needs Announce messages only. In one embodiment, Announce messages may run less frequently than Sync and Delay messages, as Announce messages are not used in PTP to determine the time offset between master and slave. As shown, the master device 110 transmits an Announce message for every sixteenth Delay Request message based on the sequence ID of the Delay Request message, such that an Announce message is transmitted in response to receipt of the Delay Request message, in addition to the Delay Response and Sync messages, with sequence ID Seq_ID 16 at event 512. Any suitable interval may be chosen for transmitting Announce messages, and the ratio of the number of Announce messages to Sync/Delay messages may be programmable in one embodiment. For example, the interval for transmitting Announce messages may be set to 1 packet or 2 packets per 32 Delay Request messages from the slave device 120. As described, the Delay Request messages may themselves be scheduled by the slave 120. For example, Delay Request messages may be sent from the slave device 120 and received by the master device 110 at a rate of 32 packets per second, and the master device 110 may then respond with Sync and Delay Response messages at 32 packets per second while transmitting 1 or 2 Announce messages per 32 Delay Request messages for a rate of 1 or 2 packets per second.

In contrast to Delay Response and Sync messages, Announce messages may not include the same sequence IDs as the Delay Request messages which the Announce messages are generated in response to. As shown, the Announce message transmitted at event 512 includes sequence ID Seq_ID 1, which is the Delay Response message sequence ID Seq_ID 16 divided by 16, the interval for transmitting Announce messages.

Figure 7:
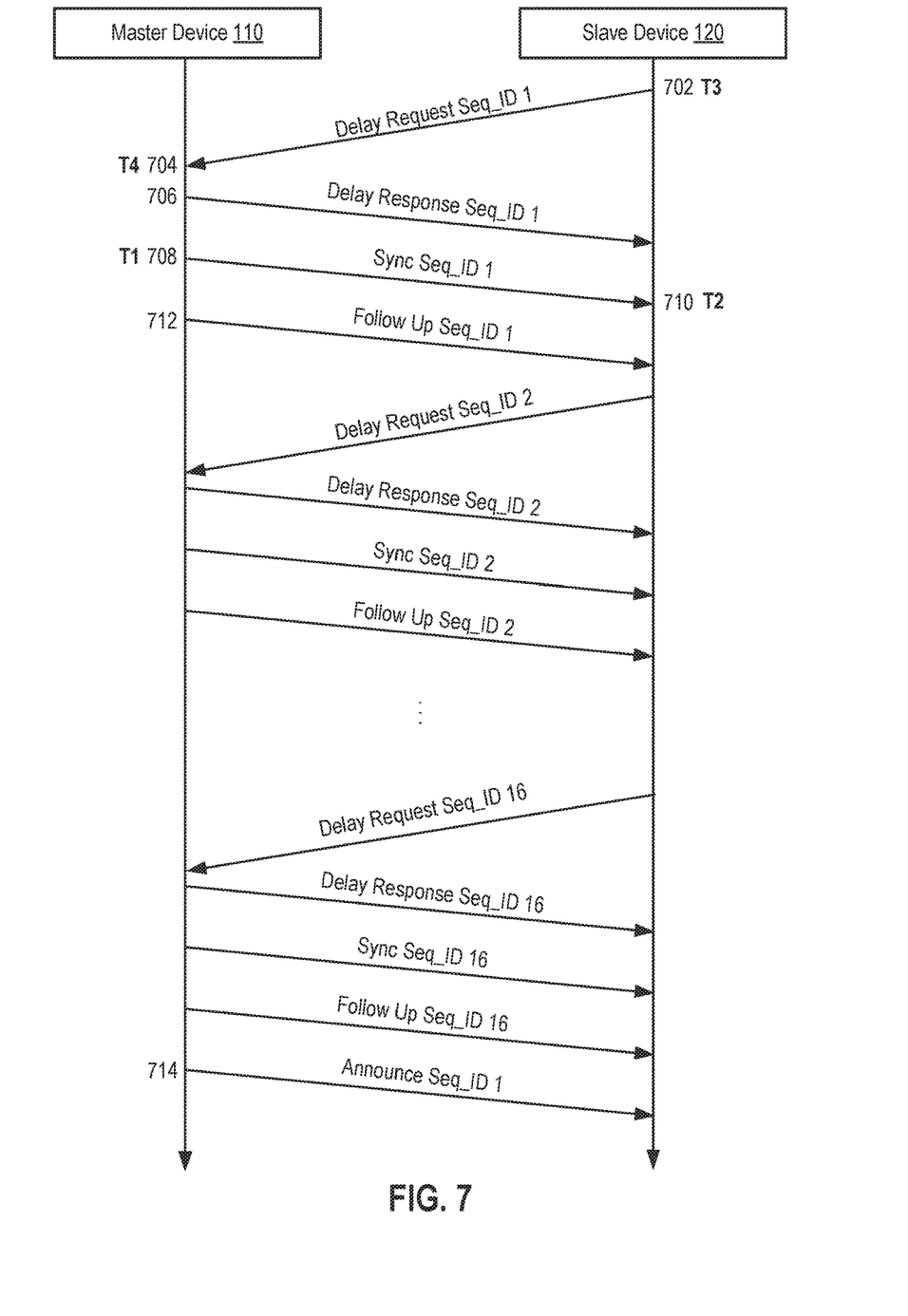
FIG. 7 provides an event diagram illustrating communications between master and slave in an event-driven two-step clock operation, according to an embodiment.

FIG. 7 provides an event diagram illustrating communications between master and slave in an event-driven two-step clock operation, according to an embodiment. The two-step clock operation differs from the one-step clock operation of FIG. 5 in that the time-of-departure $\tau_3$ measured when the Sync packet departs the master device 110 is carried in a Follow-up message to the slave device 120, as opposed to in the Sync message itself.

As shown, at event 702, slave device 120 transmits a Delay Request message and records a time-of-departure $\tau_3$ of the Delay Request message (time-stamp T3) that corresponds to an actual time-of-departure with respect to the master timescale of $t_3 = \tau_3 - \varepsilon$. At event 704, the master device 110 receives the Delay Request message and measures the time-of-arrival $t_4$ (time-stamp T4). In response to the Delay Request message, at event 706, the master device 110 transmits to the slave device 120 a Delay Response message that includes the measured time-of-arrival $t_4$ and a sequence ID Seq_ID 1 captured from the Delay Request message.

In addition to the Delay Response message, the master device 110 further transmits, at event 708, a Sync message which includes an approximate time-stamp of the time-of-departure of the Sync message. At the instant $t_1$ the Sync packet traverses a time-stamp point, which as described is ideally embedded in the physical layer of the device or in the stack as close to the physical layer as possible, a precise time-stamp T1 of this event is struck. Such a precise time-stamp T1 is then fed back to PTP application software which embeds the precise time-stamp T1 in a Follow-up message transmitted at event 712. In the PTP protocol, it suffices that the approximate time-stamp in the Sync message be within 1 second of the precise value in the Follow-up message, and one approach for achieving this is to obtain the approximate time-stamp when the Sync packet is created. The two-step PTP operation addresses delay variation associated with the sourcing system, specifically delay variation produced by the protocol stack processing in the master device 110.

As with the Delay Response message, the master device 110 generates the Sync and Follow-up messages to include the same sequence ID Seq_ID 1, indicating a correspondence between these messages and the Delay Request message with sequence ID Seq_ID 1. At event 710, the Sync message arrives at the slave device 120, and the slave device 120 measures the time-of-arrival as $\tau_2$ (time-stamp T2). The time of arrival $\tau_2$ is, with respect to the master timescale, an actual time-of-arrival of $t_2 = \tau_2 - \varepsilon$. The slave device 120 then uses the quartet of time-stamps (T1, T2, T3, T4) to align to the master device 110 by solving for the slave time offset $\varepsilon$ in the same manner as for the event-driven one-step clock operation described above, and adjusting the slave clock 125 based on the time offset.

As with the event-driven one-step clock operation, the master device 110 may sample received Delay Request messages and transmit Announce messages at any suitable interval, such as for every 16 or 32 received Delay Request messages. In one embodiment, the master device 110 may use the sequence IDs of Delay Request messages to determine whether to send Announce messages in response. Illustratively, an Announce message with sequence ID Seq_ID 1 is sent, at event 714, in response to identifying that the sequence ID Seq_ID 16 is a multiple of the 16-message interval at which the master device 110 is programmed to transmit announce messages.

Figure 8:
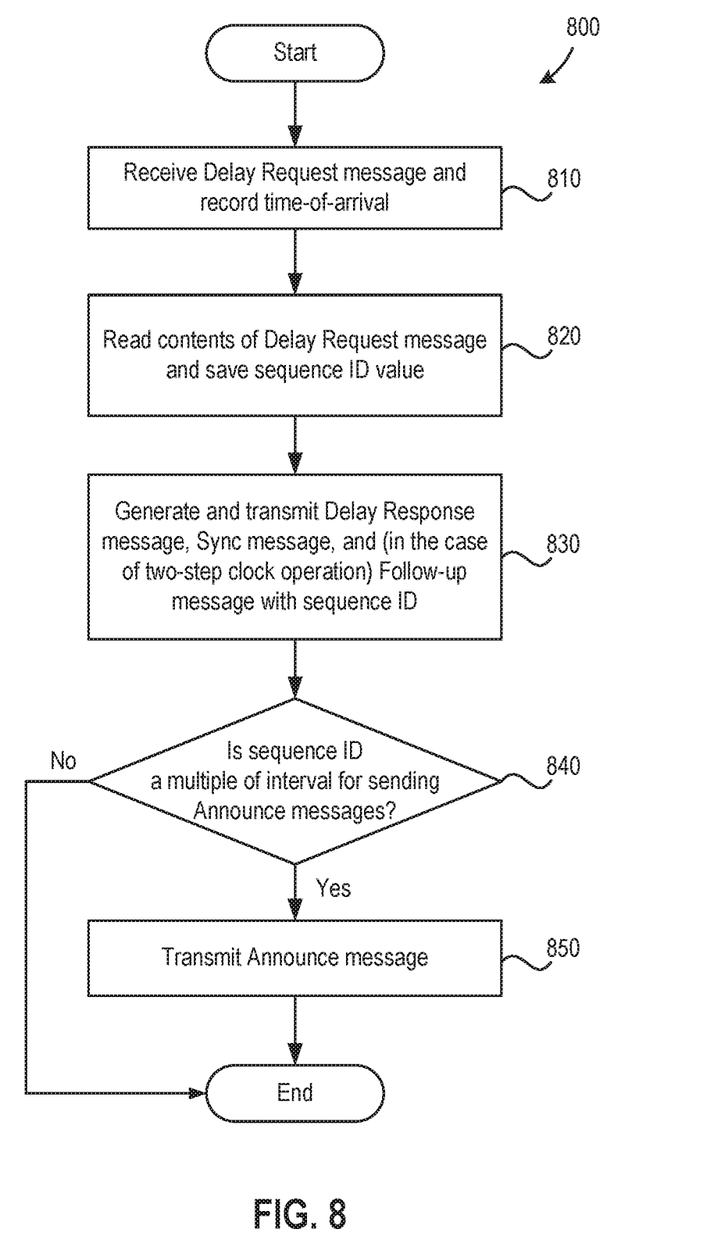
FIG. 8 depicts a flow diagram of method steps performed by a master to transfer timing signals on an event-driven basis, according to an embodiment.

FIG. 8 depicts a flow diagram of a method 800 performed by the master device 110 to transfer timing signals on an event-driven basis, according to an embodiment. As shown, at step 810, the master device 110 receives a Delay Request message and records a time-of-arrival of the message. At step 820, the master device 110 further reads contents of the Delay Request message and saves a sequence ID value of the Delay Request message.

At step 830, in response to the Delay Request message, the master device 110 generates and transmits a Delay Response message, a Sync message, and (in the case of two-step clock operation) a Follow-up message with the same sequence ID as that captured from the Delay Request message. The Delay Response message includes the time-of-arrival of the Delay Request message on the master's 110 port, the Sync message includes a time-of-departure of the Sync message (which in the two-step clock operation case may be an approximate time-of-departure), and the (optional) Follow-up message includes a precise time-of-departure of the Sync message.

At step 840, the master device 110 determines whether the sequence ID value of the Delay Request message is a multiple of the interval value for sending Announce messages. As described, any suitable interval value, such as every 16 or 32 Delay Request messages, may be programmed on the master device 110.

If the master device 110 determines at step 840 that the Delay Request message is not a multiple of the interval value, then the master device 110 does not transmit an Announce message in response to the Delay Request message. On the other hand, if the master device 110 determines that the Delay Request message is a multiple of the interval value, then at step 850, the master device 110 further transmits an Announce message to the slave device 120.

Figure 9:
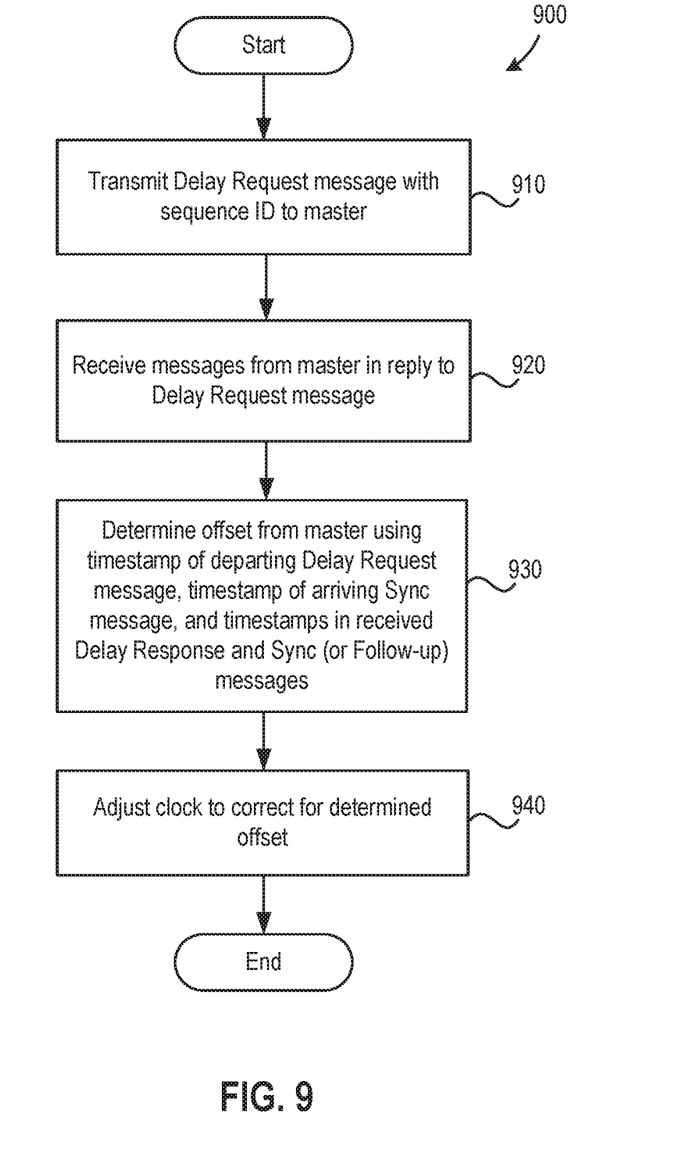
FIG. 9 depicts a flow diagram of method steps for aligning a slave clock to a master clock, according to an embodiment.

FIG. 9 depicts a flow diagram of a method 900 for aligning a slave clock to a master clock, according to an embodiment. As shown, at step 910, the slave device 120 transmits a Delay Request message with a particular sequence ID to the master device 110. As described, in contrast to conventional PTP operation, the slave device 120 does not wait for Announce or Sync messages from the master device 110 before sending this Delay Request message. Instead, the slave device 120 is configured to periodically send Delay Request message and then wait for Sync and Announce message replies from the master device 110. That is, the master's scheduler that is used in conventional PTP to transmit Sync and Announce messages at a requested rate is replaced with schedulers in the slave devices, which each send Delay Request messages at a particular rate.

At step 920, the slave device 120 receives messages from the master device 110 in reply to the Delay Request message transmitted at step 810. The received messages may include a Delay Response message, a Sync message, (in the case of two-step clock operation) a Follow-up message, and for some (e.g., every 16 or 32) Delay Request messages, an Announce message.

At step 930, the slave device 120 determines an offset from the master device 110 using a time-stamp of departure of the Delay Request message, a time-stamp of arrival of the Sync message, and time-stamps in the received Delay Response and Sync messages (or Follow-up message in the case of two-step clock operation), as described above.

Then, at step 940, the slave device 120 adjusts its clock 125 to correct for (i.e., eliminate) the determined offset.

Although discussed above primarily with respect to PTP, it should be understood that techniques disclosed herein may also be applied to other packet-based network synchronization protocols that are traditionally stateful.

Advantageously, techniques disclosed herein permit timing signals to be transferred on an event-driven basis, without relying on the master to send messages based on schedule(s). In the case of PTP, Delay Response and Sync messages (and Follow-up messages in the case of two-step clock operation) may be transmitted in response to received Delay Request messages, and Announce messages may further be transmitted in response to received Delay Request messages at predefined intervals. Doing so reduces the load on the master device and permits the master to serve a larger number of slave devices.

While the foregoing is directed to embodiments of the present invention, other and further embodiments of the invention may be devised without departing from the basic scope thereof. For example, aspects of the present invention may be implemented in hardware or software or in a combination of hardware and software. One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present invention, are embodiments of the present invention.

I claim:

1. A method of synchronizing a clock in a slave device (slave) with a clock in a master device (master), the method comprising:
   transmitting a first packet from the slave to the master;
   responsive to receiving the first packet at the master:
      determining, by the master, a time of arrival of the first packet at the master and an identifier (ID) value associated with the first packet,
      transmitting, from the master to the slave, a second packet which includes the time of arrival of the first packet at the master and the ID value associated with the first packet, and
      transmitting, from the master to the slave, a third packet which includes the ID value associated with the first packet,
   subsequent to transmitting the third packet, in response to each instance of receiving a packet from the slave that includes a sequence ID value:
      determining, by the master, whether the sequence ID value is a multiple of a predetermined interval value,
      transmitting, in the event that the sequence ID value is a multiple of the predetermined interval value, a fourth packet from the master to the slave, and
      not transmitting, in the event that the sequence ID value is not a multiple of the predetermined interval value, the fourth packet from the master to the slave; and
   synchronizing the clock in the slave device with the clock in the master device based, at least in part, on a time of departure of the first packet from the slave, the determined time of arrival of the first packet at the master, a time of departure of the third packet from the master, and a time of arrival of the third packet at the slave.

2. The method of claim 1, further comprising, subsequent to transmitting the third packet from the master to the slave:
   transmitting, from the master to the slave, a fifth packet which includes the time of departure of the third packet from the master and the ID value associated with the first packet.

3. The method of claim 1, wherein the ID value associated with the first packet is a first sequence ID value.

4. The method of claim 1, wherein the predetermined interval value is user-configurable.

5. The method of claim 1, wherein:
   the first packet is a Precision Time Protocol (PTP) Delay Request packet;
   the second packet is a PTP Delay Response packet;
   the third packet is a PTP Sync packet; and
   the fourth packet is a PTP Announce packet.

6. The method of claim 1, wherein the transmitted third packet includes the time of departure of the third packet from the master.

7. The method of claim 1, wherein one or more user-configurable parameters are set in the master and in the slave to enable the slave to transmit the first packet prior to receiving the third packet and to enable the master to transmit the third packet responsive to receiving the first packet.

8. The method of claim 1, wherein the slave is one of a plurality of servers in a datacenter or one of a plurality of receivers connected to a cable backhaul.

9. A system, comprising a master device (master) and a slave device (slave), the slave configured to transmit, to the master, a first packet,
   the master configured to perform operations comprising:
      responsive to receiving the first packet transmitted from the slave to:
         determine a time of arrival of the first packet at the master and an identifier (ID) value associated with the first packet;
         transmit to the slave a second packet which includes the determined time of arrival of the first packet at the master and the ID value associated with the first packet; and
         transmit to the slave a third packet which includes the ID value associated with the first packet;
         determine whether the sequence ID value is a multiple of a predetermined interval value;
         transmit, in the event that the sequence ID value is a multiple of the predetermined interval value, a fourth packet from the master to the slave; and
         not transmit, in the event that the sequence ID value is not a multiple of the predetermined interval value, the fourth packet from the master to the slave;
   the slave further configured to perform operations comprising:
      determine a time of departure of the first packet from the slave,
      determine a time of arrival of the third packet at the slave, and
      synchronizing a clock in the slave with a clock in the master based, at least in part, on the determined time of departure of the first packet from the slave, the determined time of arrival of the first packet at the master, a time of departure of the third packet from the master, and the determined time of arrival of the third packet at the slave.

10. The system of claim 9, the master further being configured to perform operations comprising, subsequent to transmitting the third packet to the slave:
transmit to the slave a fifth packet which includes the time of departure of the third packet from the master and the ID value associated with the first packet.

11. The system of claim 9, wherein the ID value associated with the first packet is a first sequence ID value.

12. The system of claim 9, wherein the predetermined interval value is user-configurable.

13. The system of claim 9, wherein:
the first packet is a Precision Time Protocol (PTP) Delay Request packet;
the second packet is a PTP Delay Response packet;
the third packet is a PTP Sync packet; and
the fourth packet is a PTP Announce packet.

14. The system of claim 9, wherein the transmitted third packet includes the time of departure of the third packet from the master.

15. The system of claim 9, wherein one or more user-configurable parameters are set in the master and in the slave to enable the slave to transmit the first packet prior to receiving the third packet and to enable the master to transmit the third packet responsive to receiving the first packet.

16. A clock device comprising:
one or more circuits responsive to receiving each instance of a Delay Request packet transmitted at a rate from a slave device (slave) to:
determine a time of arrival of the Delay Request packet;
transmit to the slave a Delay Response packet which includes the determined time of arrival of the Delay Request packet;
transmit to the slave a Sync packet which includes an identifier associated with the Delay Request packet; and
determine whether the sequence ID value is a multiple of a predetermined interval value,
transmit, in the event that the sequence ID value is a multiple of the predetermined interval value, an Announce packet from the master to the slave, and
not transmit, in the event that the sequence ID value is not a multiple of the predetermined interval value, the Announce packet from the master to the slave.

* * * * *